(12) United States Patent
Rimondi et al.

(10) Patent No.: US 8,320,207 B2
(45) Date of Patent: Nov. 27, 2012

(54) INTEGRATED SOLUTION FOR IDENTIFYING MALFUNCTIONING COMPONENTS WITHIN MEMORY DEVICES

(75) Inventors: Danilo Rimondi, Mozzo (IT); Carolina Selva, Cologno Monzese (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 171 days.

(21) Appl. No.: 12/960,355

(22) Filed: Dec. 3, 2010

(65) Prior Publication Data

US 2011/0158016 A1 Jun. 30, 2011

(30) Foreign Application Priority Data

Dec. 30, 2009 (IT) .............................. MI2009A2356

(51) Int. Cl.
*G11C 7/00* (2006.01)
(52) U.S. Cl. ................... 365/201; 365/189.07
(58) Field of Classification Search ............... 365/201, 365/189.07
See application file for complete search history.

(56) References Cited

U.S. PATENT DOCUMENTS

| | | | |
|---|---|---|---|
| 6,216,239 B1 | 4/2001 | Lien | |
| 6,928,593 B1 * | 8/2005 | Halbert et al. | 714/718 |
| 2004/0188716 A1 | 9/2004 | Gappisch et al. | |

FOREIGN PATENT DOCUMENTS

WO   WO 2007001260 A1   1/2007

OTHER PUBLICATIONS

Italian Search Report dated Apr. 23, 2010 from corresponding Italian Application No. MI2009A002356.
Written Opinion dated Apr. 23, 2010 from corresponding Italian Application No. MI2009A002356.

* cited by examiner

*Primary Examiner* — Son Dinh
*Assistant Examiner* — Nam Nguyen
(74) *Attorney, Agent, or Firm* — Wolf, Greenfield & Sacks, P.C.

(57) ABSTRACT

A method for testing a memory device. The memory device includes a matrix of memory cells having a plurality of rows and columns; the matrix includes a plurality of rows of operative memory cells each one for storing a variable value and at least one row of auxiliary memory cells each one storing a fixed value. The memory device further includes writing circuitry for writing selected values into the operative memory cells, and reading circuitry for reading the values being stored from the operative or auxiliary memory cells. The method includes reading output values from the row of auxiliary memory cells, determining a malfunctioning of the memory device in response to a missing match of the output values with the fixed values, determining a cause of the malfunctioning according to a pattern of reading errors between the output values and the corresponding fixed values, and providing a signal indicative of the cause of the malfunctioning.

12 Claims, 5 Drawing Sheets

INTEGRATED SOLUTION FOR IDENTIFYING MALFUNCTIONING COMPONENTS WITHIN MEMORY DEVICES

CROSS REFERENCE TO RELATED APPLICATIONS

This application claims the priority benefit of Italian patent application number MI2009A002356, filed on Dec. 30, 2009, entitled "Integrated Solution for Identifying Malfunctioning Components Within Memory Devices," which is hereby incorporated by reference to the maximum extent allowable by law.

BACKGROUND OF THE INVENTION

1. Field of the Invention

An embodiment of the present invention relates to the test field. More specifically, embodiments relate to the test of memory devices.

2. Discussion of the Related Art

The memory devices are generally subject to a test (for example, a functional test) to verify their correct operation; this is of the utmost importance to ensure a high quality of the production process of the memory devices. However, with the increase of the integration of memory devices, the difficulties of execution of the functional test accordingly increase, thereby making such functional test not always reliable and accurate.

A class of memory devices that has a very high integration, called VLSI (Very Large Scale of Integration), is represented, for example, by static random access memory devices, or SRAM (Static Random Access Memory). Typically, a generic memory device includes a matrix of memory cells, each one of which can store a binary information, or bit (i.e., the logic value "0" or "1"); the memory device also includes corresponding peripheral circuits, which in general accomplish functions of management and access to the memory cells.

The high integration to which such memory devices are subject makes it difficult to run their functional test according to standard methodologies, for example, through the use of probes for accessing input/output pins of the memory device. In fact, in this case it turns out to be not easy to make the probing with such pins precisely without damaging them; moreover, the probing of the pins in any case does not ensure a direct access to input/output terminals of the memory matrix and/or of the peripheral circuits. For this reason, the memory devices are also usually provided with a test apparatus, called BIST (Built-In Self Test) machine, which, by directly contacting the input/output terminals of the memory device, independently runs the functional test of the memory device. To such purpose, the BIST machine performs write operations of predefined bits on each memory cell, followed by read operations of the bits being just written; according to a comparison between the read bits and their expected values, the BIST machine outputs a result of the functional test. Such result is simply a flag indicating the success or the failure of the functional test and, if necessary, an indication of a number of errors (i.e., mismatches between read bits and expected values) that have occurred in the course of the functional test. In such way, the execution of the functional test requires the exchange of simple signals (for its activation and for outputting its result) to few pins of the memory device (for example, through a JTAG interface).

Although widely used, such functional test allows obtaining only general information about the state of the whole memory device; in fact, the write and read operations being performed by the BIST machine during the execution of the functional test involve different functional blocks, including the memory cells and the (write and read) peripheral circuits of the memory device. For this reason, in case of failure of the functional test of the memory device it is not possible to determine to which one of the functional blocks the failure is due.

In addition, within the peripheral circuits, the failure may be in different components—for example, write multiplexers or read multiplexers (used for transferring data to or from the memory cells being selected during the write or read operations, respectively), write drivers (used for writing the selected memory cells), sense amplifiers (used for reading the selected memory cells) or bit lines (used for coupling the memory cells with the multiplexers).

For this reason, if it is desired to perform a failure analysis for identifying a cause of the failure within a function block of the memory device (i.e., the memory cells or a component of the peripheral circuits) and for providing corresponding solutions, no indication would be available neither about the functional block to be examined, nor least of all about the component on which the attention has to be focused; therefore, such failure analysis would require very long times, being sometimes incompatible with the project timing being requested nowadays.

In its general terms, the solution according to one or more embodiments of the present invention proposes using auxiliary memory cells storing fixed values for checking the functionality of the memory device.

In particular, one or more aspects of the solution according to an embodiment of the invention are set out in the independent claims, with advantageous features of the same solution that are indicated in the dependent claims (whose wording is enclosed herein verbatim by reference).

SUMMARY OF THE INVENTION

An embodiment of the invention provides a method for testing a memory device. The memory device includes a matrix of memory cells having a plurality of rows and columns; the matrix includes a plurality of rows of operative memory cells each one for storing a variable value and at least one row of auxiliary memory cells each one storing a fixed value. The memory device further includes writing means for writing selected values into the operative memory cells, and reading means for reading the values from the operative or auxiliary memory cells. The method according to an embodiment of the present invention includes reading output values from the row of auxiliary memory cells, determining a malfunctioning of the memory device in response to a missing match of the output values with the fixed values, determining a cause of the malfunctioning according to a pattern of reading errors between the output values and the corresponding fixed values, and providing a signal indicative of the cause of the malfunctioning.

Another embodiment of the invention provides a system including means for implementing such method (with the same advantageous features being recited in the dependent claims for the method that apply mutatis mutandis to the system). In particular, such system may be a simple memory device (which includes the means of above), or a test system.

Another embodiment of the invention provides a complex system including one or more of such memory devices.

Another embodiment of the invention provides a program for executing such method (for example, under the control of a microcontroller of the memory device or a computer of the test system).

BRIEF DESCRIPTION OF THE DRAWINGS

Embodiments of the invention, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity, and the name of each entity is generally used to denote both its type and its attributes—such as its value, content and representation—for the sake of simplicity). In particular.

DETAILED DESCRIPTION

Figure 1:
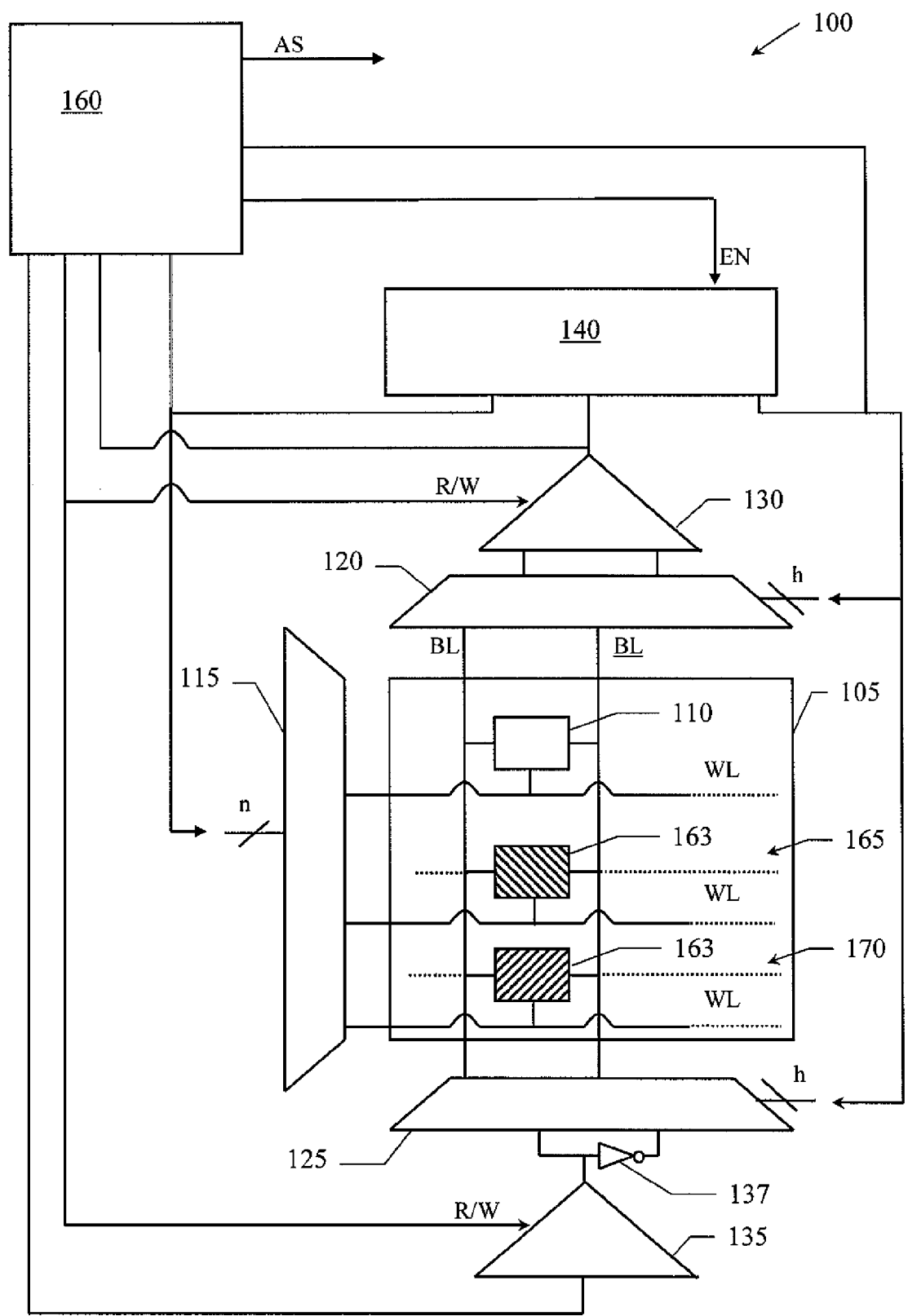
FIG. 1 is a schematic representation of a memory device in which the solution according to an embodiment of the present invention may be applied.

With particular reference to FIG. 1, there is shown a schematic representation of a memory device 100 in which the solution according to an embodiment of the present invention may be applied. For the sake of exposure brevity, in such memory device 100 there are shown and described only functional blocks (and corresponding components) being directly involved in the proposed solution. In particular, the memory device 100 is of the SRAM-type. The memory device 100 includes a matrix 105 of memory cells 110, which is arranged in rows and columns. Each memory cell 110 (only one shown in the figure) can store one information bit. Normally, the memory device 100 concurrently processes (in writing and reading) words of a determined number of bits, which are stored in corresponding memory cells 110 of a same row (e.g., 8 memory cells 110 for an 8-bits word).

The matrix 105 also includes a plurality of main bit lines BL being alternated to negated bit lines BL, and a plurality of word lines WL. Each memory cell 110 of a same column of the matrix 105 is connected to a same bit line pair BL, BL, while each memory cell 110 of a same row of the matrix 105 is connected to a same word line WL. The bit line pairs BL, BL are logically grouped in packets, each one of which is associated with the memory cells 110 of a corresponding i-th bit of all the words (thus with 8 packets of bit line pairs BL, BL in the example at issue). Each word is selected (in reading and writing) through a corresponding address being received from the outside of the memory device 100, which address includes a row address n and a column address h. The selection of the word line WL of the selected word is carried out through a row decoder 115, which in response to the row address n in input enables the word line WL of the selected word. The selection of the bit line pair BL, BL of each i-th bit of the selected word is instead carried out through corresponding read multiplexers 120 (in the case of reading of the word) or through corresponding write multiplexers 125 (in the case of writing of the word). Each (read or write) multiplexer 120, 125 selects the bit line pair BL, BL of the selected word in the corresponding bit line packet BL, BL depending on the value of the column address h in input. In such way, each memory cell 110 of the i-th bit of the selected word (to be read or written) is selected through the enabled word line WL and the corresponding enabled bit line pair BL, BL.

The read multiplexer 120 and the write multiplexer 125 of each i-th bit interface with a sense amplifier 130 and with a write driver 135, respectively. The sense amplifier 130 is input a bit being read from the selected memory cell 110 (through the corresponding main bit line BL) and the same negated bit (through the corresponding negated bit line BL), and outputs such read bit. The write driver 135, instead, is used for providing, directly to the selected bit line BL, and through an inverter 137 to the selected negated bit line BL, a bit to be written into the selected memory cell 110 so as to reduce a switching time being associated with the selected bit line pairs BL, BL (due to the charge/discharge time of the capacitors being associated therewith). The sense amplifier 130 and the write driver 135 typically include corresponding latches (not shown), which are used for temporarily storing the read bit or the bit to be written until a clock enables the read or write operation, respectively.

Therefore, the memory device 100 so far described may be functionally divided into two main functional blocks: a storage block (including the matrix 105 of memory cells) and a peripheral block in charge of the read and write operations (including different components: read multiplexers 120, write multiplexers 125, sense amplifiers 130, write drivers 135 and bit lines BL, BL).

According to an embodiment of the present invention, the memory device 100 also includes a control logic 140, which is used for generating, in response to an enable signal EN, the row addresses n and the column addresses h within the memory device 100, so as to allow the execution of an analysis procedure aimed at checking a correct operation of some components of the memory device 100 (as will be described in detail in the following); the control logic 140 provides the row addresses n to the row decoder 115 and provides the column addresses h to the read multiplexers 120 and to the write multiplexers 125. The memory device 100 further includes a microcontroller 160 for managing operations being necessary to implement the analysis procedure. The microcontroller 160 is input, from the sense amplifiers 130, the bits being read from the corresponding selected memory cells 110, and also receives, from the control logic 140, the row address n and the column address h of the selected word (in reading or writing). The microcontroller 160 outputs the enable signal EN for the control logic 140 and a signal R/W for enabling the write driver or the sense amplifier only when necessary (i.e., during read or write operations, respectively), so as to not dissipate power if not used. The microcontroller 160 also outputs an analysis signal AS, which indicates a success or a failure of the analysis procedure and, in case of failure, provides an indication of one or more possible components of the memory device 100 (between the read multiplexers 120, the write multiplexers 125, the write drivers 135, the sense amplifiers 130 and the bit lines BL, BL) at the origin of the failure of the analysis procedure.

Finally, the matrix 105 includes a plurality of additional rows of memory cells (e.g., from one to four), which are used by the microcontroller 160 for performing the analysis procedure, as will be described in detail in the following. In the example in the figure, the matrix 105 includes a first additional row 165 of memory cells 163 and a second additional row 170 of memory cells 163. The memory cells 163 are substantially equivalent to the memory cells 110, with the difference that each memory cell 163 is pre-programmed (i.e., wired) to a determined fixed value (i.e., logic value 1 or logic value 0). For example, the memory cells 163 of the row 165 are pre-programmed alternately at the logic value 0 and at the logic value 1 (so that the memory cells 163 of the row 165 belonging to words with adjacent column addresses always store different values); the memory cells 163 of the row 170 instead store opposite values with respect to the memory cells 163 of the row 165 (for the same column addresses).

Figure 2A:
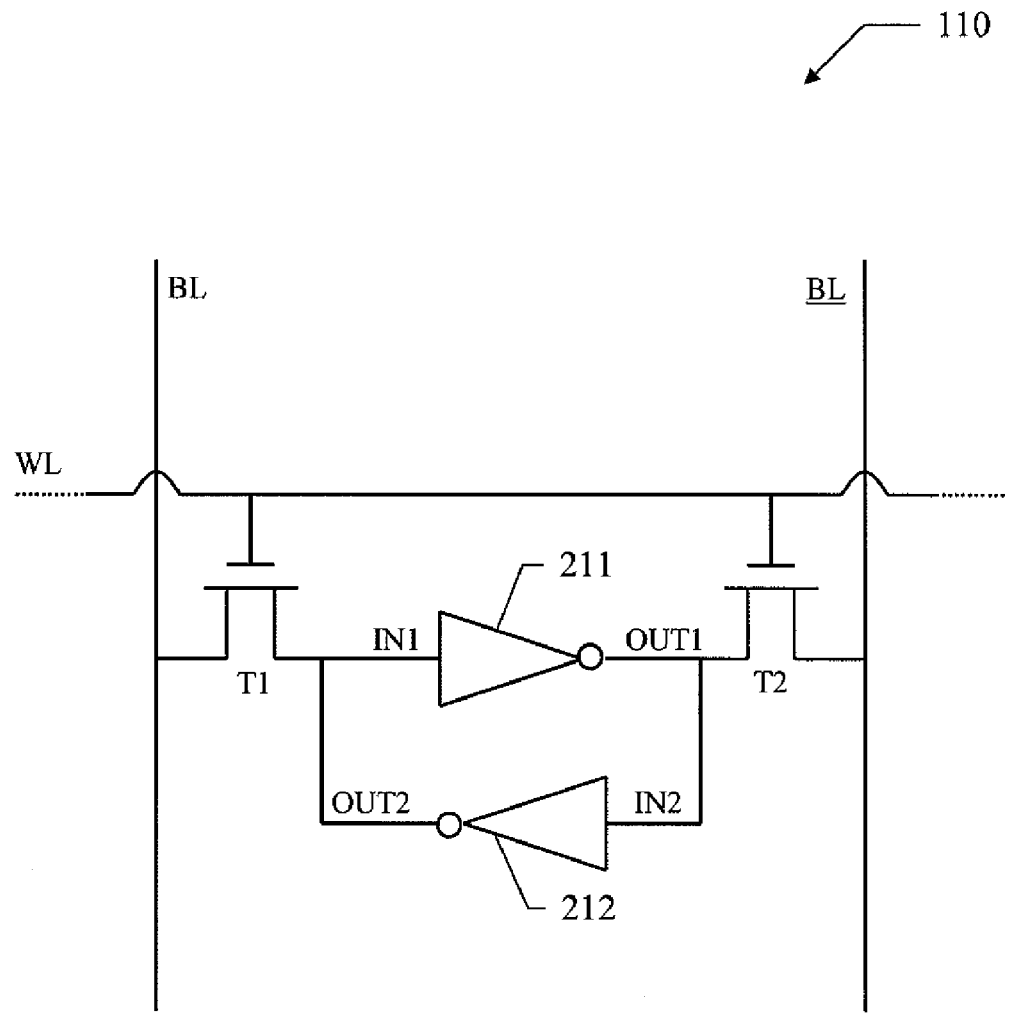
FIG. 2A is a schematic representation of a standard memory cell included in such memory device.

Turning now to FIG. 2A, there is shown a schematic representation of a generic memory cell 110 being known in the state of the art; the memory cell 110 includes two NOT logic gates 211 and 212; each NOT logic gate 211, 212 includes an input terminal IN1, IN2 and an output terminal OUT1, OUT2, which provides an inverted signal with respect to a signal being applied at the input terminal IN1, IN2. The NOT logic gates 211, 212 are connected to each other in positive feedback; in detail, the output terminal OUT1, OUT2 of each NOT logic gate 211, 212 is coupled with the input terminal IN2, IN1 of the other NOT logic gate 212, 211. In such way, the memory cell 110 has two stable conditions. In particular, when the output terminal OUT1 is at a voltage corresponding to the logic value 1 (for example, a high voltage being equal to a supply voltage, such as 3.3V with respect to a reference or ground voltage) and the output terminal OUT2 is at a voltage corresponding to the logic value 0 (for example, a low voltage being equal to the ground voltage), the memory cell 110 stores the logic value 0; on the contrary, when the output terminal OUT1 is at the voltage corresponding to the logic value 0 and the output terminal OUT2 is at the voltage corresponding to the logic value 1, the memory cell 110 stores the logic value 1.

The memory cell 110 also includes two MOS transistors T1 and T2 (for example, of the N-channel type); the transistor T1 includes a first conduction terminal (source/drain) being coupled with the corresponding main bit line BL, a second conduction terminal being coupled with the input terminal IN1 of the NOT logic gate 211 (and hence with the output terminal OUT2 of the NOT logic gate 212) and a control terminal being coupled with the corresponding word line WL. Similarly, the transistor T2 includes a first conduction terminal being coupled with the corresponding negated bit line BL, a second conduction terminal being coupled with the input terminal IN2 of the NOT logic gate 212 (and hence with the output terminal OUT1 of the NOT logic gate 211) and a control terminal being coupled with the word line WL.

The operation of the memory cell 110 may be summarized as follows. In a stand-by condition the word line WL is not enabled (for example, at the low voltage); therefore, the transistors T1, T2 are turned off and the two NOT logic gates 211 and 212 are isolated from the main bit line BL and the negated bit line BL, respectively. In such way, the memory cell 110 maintains its status (and thus the stored bit) unchanged. In case of writing of a bit into the memory cell 110, the main bit line BL and the negated bit line BL are pre-charged to the voltage value of the bit to be written and to its negated logic value, respectively; then the word line WL is enabled (for example, at the high voltage), so that the transistors T1, T2 come into conduction thereby coupling the terminals IN1, OUT2 with the main bit line BL and the terminals IN2, OUT1 with the negated bit line BL, respectively; in this way, the memory cell 110 moves to the condition corresponding to the bit to be written; by deselecting the word line WL, the written bit remains stored in the memory cell 110 until a new write operation on it (or until the shutting down of the memory device).

When the memory cell 110 is selected during a read operation, both the main bit line BL and the negated bit line BL are pre-charged up to a predetermined voltage value (for example, the high voltage); the word line WL is then enabled, so that the transistors T1 and T2 come into conduction, thereby coupling the terminals IN1, OUT2 with the main bit line BL and the terminals IN2, OUT1 with the negated bit line BL, respectively. In this way, depending on whether the memory cell 110 stores the logic value 0 or the logic value 1, the main bit line BL or the negated bit line BL, respectively, will begin to discharge and the sense amplifier (not shown in the figure) will detect a voltage difference between the two bit lines BL and BL; the polarity of such voltage difference, positive or negative depending on whether the main bit line BL or the negated bit line BL discharges, allows determining the bit being stored in the memory cell 110 (1 or 0, respectively).

Figure 2B:
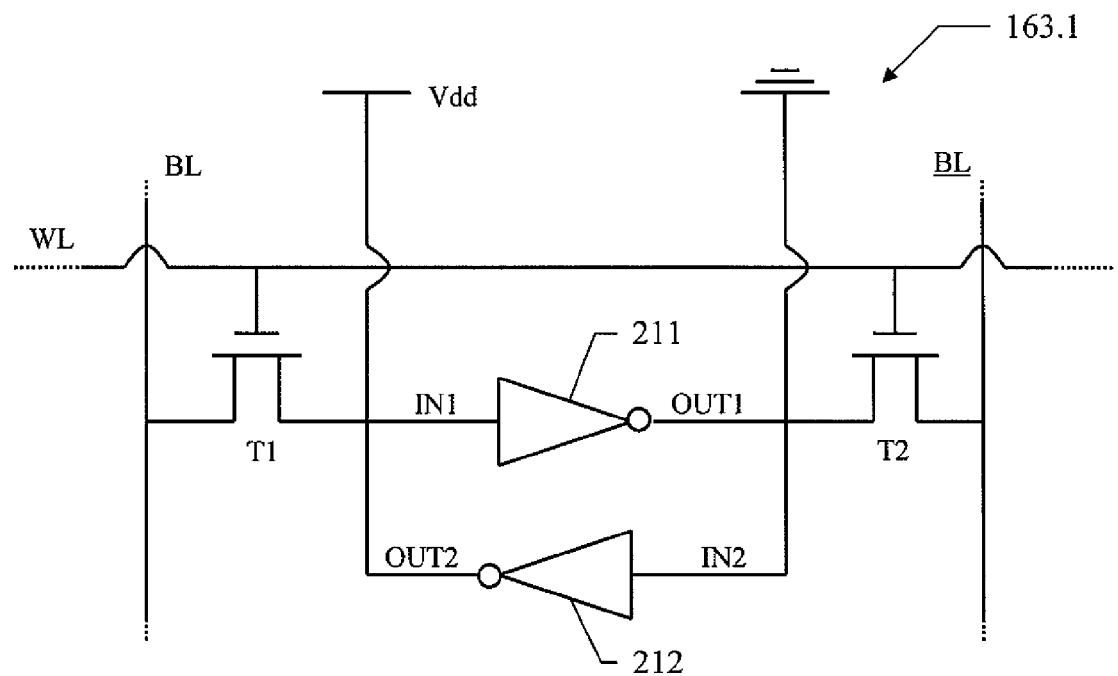
FIG. 2B is a schematic representation of pre-programmed memory cells included in such memory device that may be used for implementing the solution according to an embodiment of the present invention, and FIG. 3A
Figure 2B:
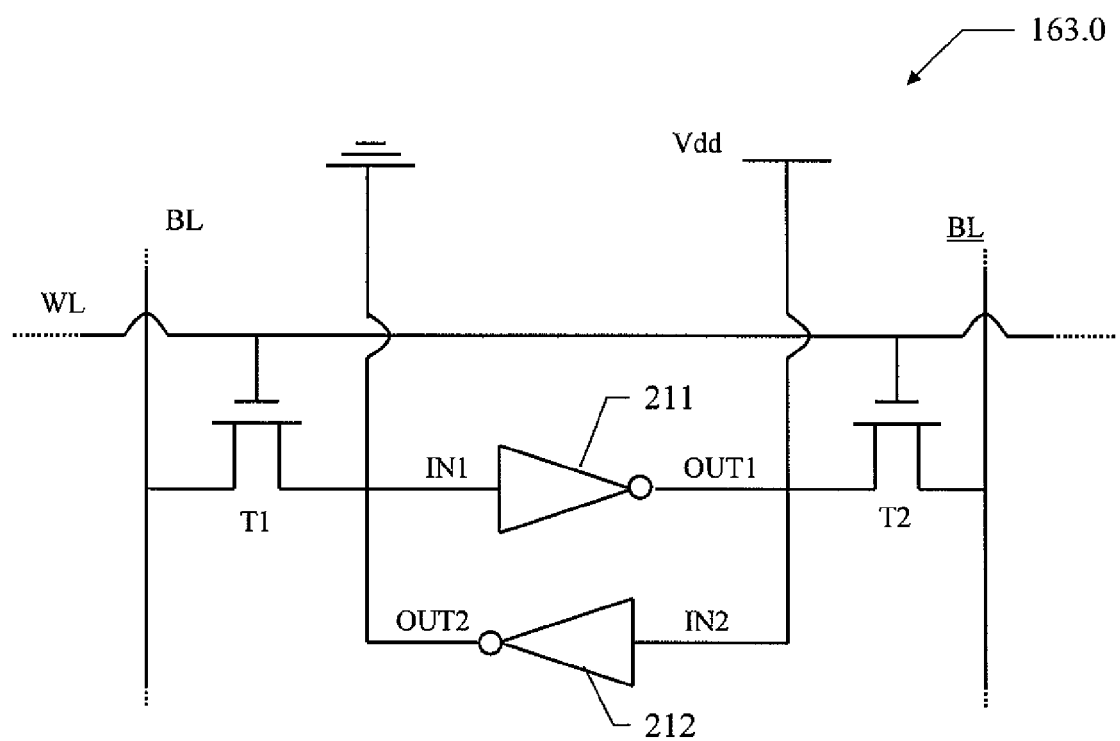

FIG. 2B is a schematic representation of a memory cell being pre-programmed to the logic value 1 (indicated with the reference 163.1), and of a memory cell being pre-programmed to the logic value 0 (indicated with the reference 163.0), which may be used for implementing an embodiment of the present invention. The pre-programmed memory cells 163.1, 163.0 have a similar structure to that shown in FIG. 2A. However, in the pre-programmed memory cell 163.1 the terminals IN1, OUT2 and the terminals IN2, OUT1 are coupled with a supply terminal Vdd (providing the high voltage corresponding to the logic value 1) and a ground terminal (providing the low voltage corresponding to the logic value 0), respectively; vice-versa in the pre-programmed memory cell 163.0 the terminals IN1, OUT2 and the terminals IN2, OUT1 are coupled with the ground terminal and the supply terminal Vdd, respectively.

Figure 3A:
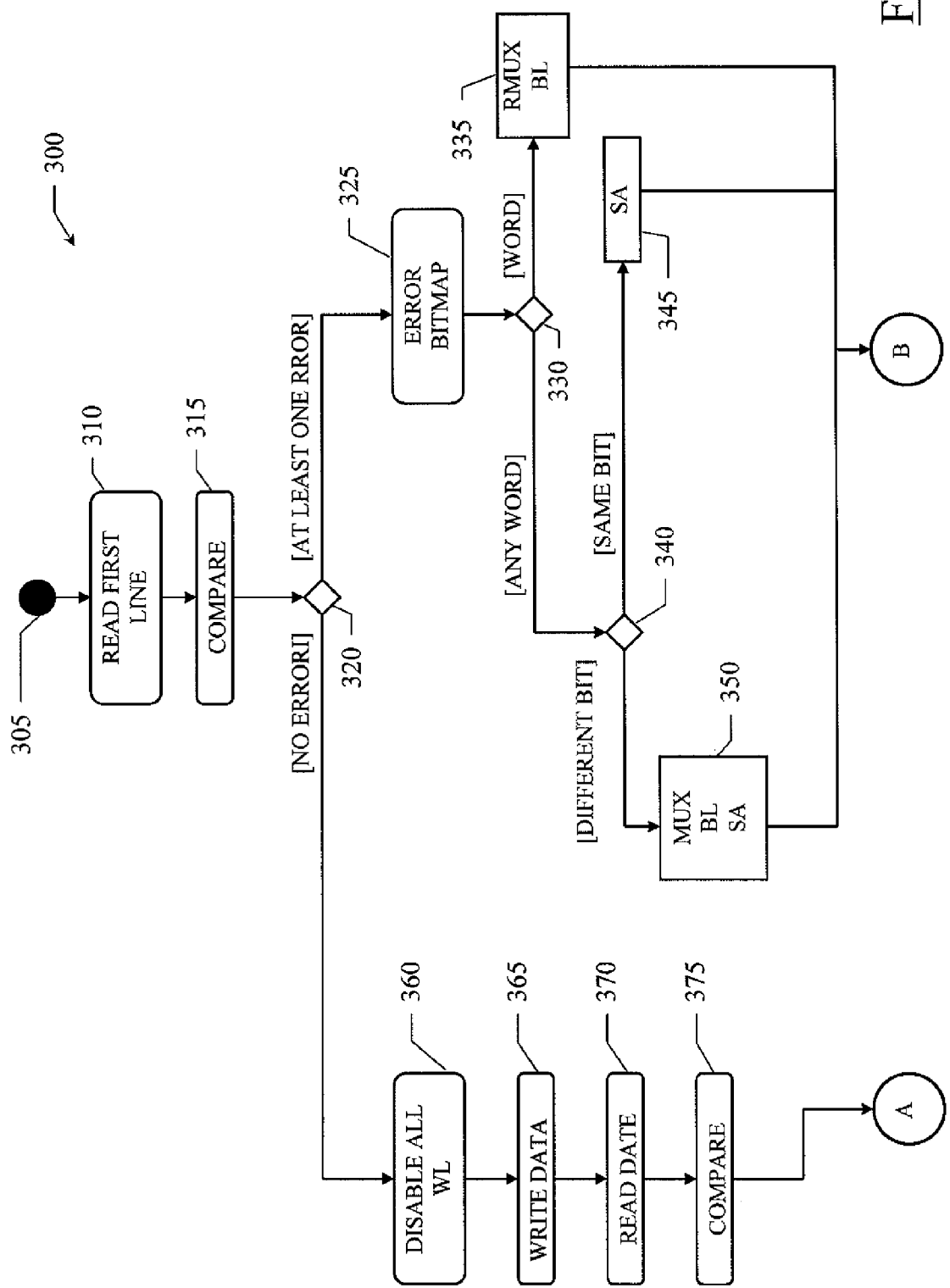
-FIG. 3B is a simplified activity diagram of the flow of operations relating to an implementation of the solution according to an embodiment of the invention.
Figure 3B:
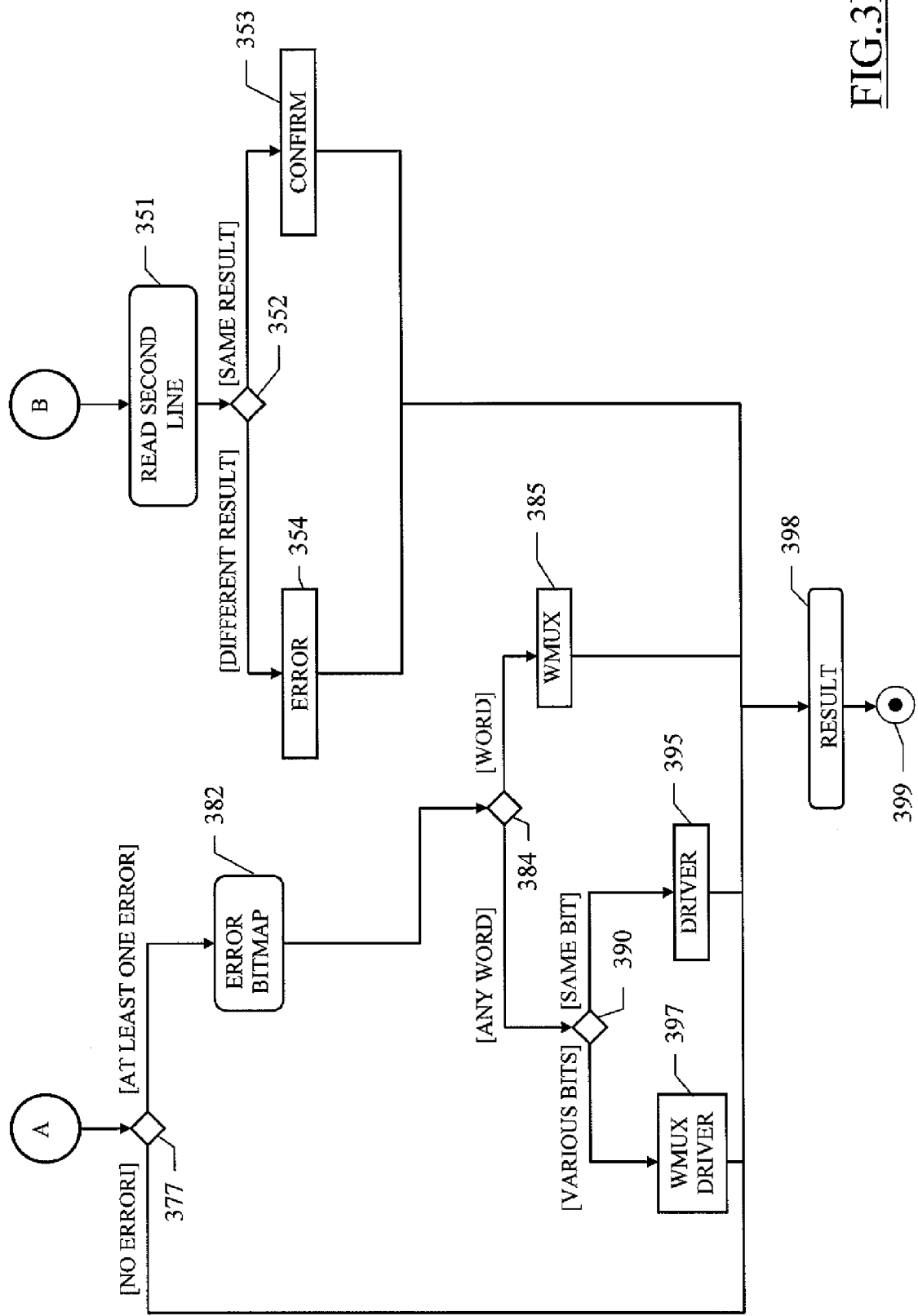

With reference now to FIG. 3A-FIG. 3B, there is shown a simplified activity diagram of the flow of operations relating to an implementation of the solution according to an embodiment of the present invention. Such operations are performed under the control of a corresponding program, which is stored in a mass memory of the microcontroller (for example, a ROM), and loaded (at least partly) into a working memory thereof (for example, a RAM) when the program is running.

The program implements a method 300 for performing an analysis procedure of the memory device; such method begins at the black start circle 305, and then proceeds to perform a read test for checking the correct operation of the components of the peripheral block being involved in the read operations (or, more simply, read components)—i.e., the read multiplexers, the sense amplifiers and the bit lines. In particular, the microcontroller at the block 310 enables the control logic (through the corresponding enable signal EN) to generate the row address and sequentially the column addresses of each word of the first row of pre-programmed memory cells, and asserts the signal R/W (for example, by bringing it to the logic value 1) so as to enable the corresponding sense amplifiers; in this way, a read operation of all the words of the first row of pre-programmed memory cells is carried out. The microcontroller, by acquiring each read bit from the sense amplifiers and the respective row and column addresses from the control logic, creates a corresponding bitmap, which is then stored into an internal memory of the microcontroller. The microcontroller then performs a comparison at the block 315 between the read bits and the expected bits; such comparison is carried out by comparing the just derived bitmap with a bitmap being pre-loaded in the microcontroller memory storing the (known) bits of the first row of pre-programmed memory cells.

The activity flow then branches at the block 320 according to the result of such comparison; if the comparison between the bitmaps has provided a negative result, that is, there has been detected a number of errors (i.e., read bits different from the corresponding expected bits) exceeding a threshold value (e.g., 20%, and preferably 10%, such as 1 bit within each 8-bits word), then the microcontroller interprets such result as a failure of the read test being caused by a malfunctioning of the reading components, and derives a corresponding error bitmap (block 325). Such error bitmap includes a flag for each pre-programmed memory cell of the first row, which is asserted if its reading has caused an error or de-asserted otherwise.

At this point, the microcontroller at the block 330 executes a test on the pattern of the errors within the error bitmap, so as to be able to provide a possible indication of the reading component that may have caused the failure of the read test; in particular, if at least one full word of the first row has been correctly read (right branch of the decision block 330), then it is possible to exclude that the cause of failure is due to the sense amplifiers, since a malfunctioning thereof would have presumably caused an error in the reading of all the bits (of each word) that are in same positions (and thus that are associated with the same sense amplifier). Therefore, the microcontroller at the block 335 infers a possible malfunctioning in the read multiplexer or in the bit lines and save such result into an analysis variable.

If instead there has been detected no word being read in a totally correct way (left branch of the decision block 330), then the microcontroller, again based on the error bitmap, runs a new test at the block 340 for checking if read errors of all the bits (of each word) in same positions have occurred. If the result is positive, then it is possible to attribute the cause of failure to the corresponding sense amplifiers; therefore, the microcontroller at the block 345 infers a possible malfunctioning in such sense amplifiers and saves the result into the analysis variable. If instead the result is negative, i.e., the pattern of the failed bits is distributed in various way within the error bitmap, then it is not possible to determine the cause of the failure more precisely; therefore, the microcontroller at the block 350 identifies a general failure of the read components (which may be caused by the read multiplexers, the sense amplifiers, or the bit lines) and save such result into the analysis variable.

At this point, regardless of which read component the microcontroller has identified to be the cause of the failure, the analysis procedure continues in a similar way from the block 335, 345 or 350 to the block 351; in particular, a further read test being completely equivalent to that performed for the first row of pre-programmed memory cells is carried out for each one of the other rows of pre-programmed memory cells of the memory device. At the end of such further read test, the microcontroller checks at the block 352 if the results of all the read tests (performed on the different rows of pre-programmed memory cells) are consistent; in particular, if all the read tests have provided the same value of the analysis variable indicating the same malfunctioning read component (right branch of the decision block), then the microcontroller at the block 353 confirms such value of the analysis variable; the analysis procedure then proceeds to the block 398 (described in the following). Otherwise (left branch of the decision block 352), the microcontroller at the block 354 saves an analysis variable including a code being indicative of a consistency problem; such consistency problem indicates that it might be necessary a comprehensive review, both in terms of layout and in terms of design, of the whole memory device. Also in this case, the analysis procedure continues to the block 398.

Returning now to the decision block 320, if the result of the read test has provided a positive result, that is, if there is a correspondence between the compared bitmaps, it is possible to determine the correct operation of all the read components of the memory device.

At this point, the activity flow of the analysis procedure proceeds to perform a write test aimed at checking the correct operation of the components of the peripheral block being in charge of the write operations (or, more simply, write components)—i.e., the write multiplexers, and the write drivers (without the bit lines since already checked previously). To such purpose, at the block 360 the microcontroller enables the write drivers and disables the sense amplifiers (by de-asserting the corresponding signal R/W), and commands the control logic (through a further enable signal EN) to supply in succession the column addresses of the words of the first row of the matrix but not the row addresses; in this way, being all the word lines of the matrix de-selected, each memory cell turns out to be isolated from the corresponding bit line pair BL, BL. At this point the microcontroller sends a sequence of bits to be written into the memory cells to the write drivers, and at the same time it saves the values and the corresponding column addresses thereof into a bitmap of the written bits. Then, during the write operation, each i-th bit is addressed by the write driver towards each selected bit line pair BL, BL (of the corresponding packet) and from there directly transferred to the read multiplexer (to be subsequently provided to the sense amplifier). The bits being provided to the sense amplifiers are then read at the block 370 (by asserting the signal R/W) and stored into a corresponding bitmap of the read data.

At this point, a comparison (block 375) is carried out between the bitmap of the written data and the bitmap of the read data. The activity flow then branches at the block 377 according to the result of such comparison; if the comparison of the bitmaps has provided a negative result, that is, the detected number of errors (i.e., read bits different from written bits) exceeds a threshold value (e.g., 20%, and preferably 10%, such as 1 bit within each 8-bits word), then the microcontroller interprets such result as a failure of the write test being caused by a malfunctioning of the write components, and derives a corresponding error bitmap (block 382).

Then the microcontroller at the block 384 executes a test on the pattern of the errors within the error bitmap, so as to provide a possible indication of the write functional block that may have caused the failure of the write test; in particular, if at least one whole word has been correctly written (right branch of the decision block 384), then it is possible to exclude that the cause of the failure is due to the write drivers, since a malfunctioning thereof would have presumably caused an error in the writing of all the bits (of each word) that are in same positions (and thus that are associated with the same write driver). Therefore, the microcontroller at the block 385 infers a possible malfunctioning in the write multiplexer and save such result into the analysis variable. The procedure then passes to the block 398.

If instead there has been detected no word being read in a totally correct way (left branch of the decision block 384), then the microcontroller, again based on the error bitmap, runs a new test at the block 390 for checking if there have been write errors of all the bits (of each word) in same positions. If the result is positive, then it is possible to attribute the cause of the failure of the write test to the corresponding write drivers; therefore, the microcontroller at the block 395 infers a possible malfunctioning in such write drivers and saves the result into the analysis variable. If instead the result is negative, i.e., the pattern of the failed bits is distributed in various ways within the error bitmap, then it is not possible to determine the cause of the failure more precisely; therefore, the microcontroller at the block 397 identifies a general malfunctioning of the write functional blocks (that may be caused by the write multiplexers or by the write drivers) and saves such result into the analysis variable. In both cases, the analysis procedure then passes to the block 398.

Returning now to the decision block 377, if the result of the write test has provided a positive result, that is, if there is a correspondence between the compared bitmaps, it is possible to determine the correct operation of all the write components of the peripheral block of the memory device, and the microcontroller saves such result into the analysis variable. The procedure then passes to the block 398.

With reference now to the block 398, the microcontroller outputs the value of the analysis variable indicating the result of the analysis procedure; such result includes information about the correct or the incorrect operation of the peripheral block of the memory device being in charge of the read and write operations, and, in case of failure, indications about which read or write component of such peripheral block is presumably malfunctioning (as a possible cause of the failure of the analysis procedure). At this point, the analysis procedure ends to the double end black circle 399.

The solution according to an embodiment of the present invention therefore allows checking the correct operation of each peripheral block of the memory device; moreover, in case of a malfunctioning of such peripheral block, there is provided an indication of the (read or write) components that may have caused it. In particular, in the specific embodiment described above it is possible to discriminate, at least indicatively, malfunctioning in the bit lines, write multiplexers, read multiplexers, write drivers or sense amplifiers. This turns out to be particularly advantageous, especially when it is desired to carry out a subsequent failure analysis (for identifying the cause of the malfunctioning within the component that has produced the same and providing corresponding solutions). In fact, the described analysis procedure provides a first important indication on which components of the peripheral block the failure analysis has to be focused, with an evident saving of time.

The described solution also has the non negligible advantage of being able to be easily implemented in combination with the functional tests being performed by a BIST machine (by exploiting the fact that the memory devices are typically already provided with such BIST machine), which BIST machine may be easily provided with additional input terminals for carrying out the operations that implement the above described analysis procedure. In this way, the results being provided by the analysis procedure according to an embodiment of the present invention may be used in combination with the result of the functional test of a BIST machine; for example, a positive result of the described analysis procedure and a negative result of the functional test would allow focusing the failure analysis directly on the memory matrix with concrete success possibilities.

Such result is obtained by means of few additional steps with respect to the known procedures including the functional test being performed by a BIST machine. Furthermore, such method leaves substantially unchanged the size of the memory device; in fact, both the microcontroller and the additional rows of pre-programmed memory cells affect the overall area occupancy of the memory device only minimally.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, the same solution may even be practiced without the specific details set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

For example, embodiments of the invention lends themselves to be implemented by an equivalent method (by using similar steps, removing some steps being not essential, or adding further optional steps); moreover, the steps may be performed in different order, concurrently or in an interleaved way (at least partly).

Moreover, the proposed method may be integrated with other tests, for example, with tests being performed by a BIST (Built-In Self Test) machine already implemented within the memory device, or it may be used in a reliability test (such as a burn-in test); in addition or in alternative, such method may be used exclusively for outputting informative results (for example, the bitmaps being derived during the execution of the analysis procedure) that may be processed by suitable calculation software being implemented, for example, on personal computers both external and within a test system, or they may be analyzed directly by an operator for personally carrying out observations about the malfunctioning of the components of the memory device. In any case, nothing prevents implementing the above-described solution stand-alone (also without any integration with other tests).

Similar considerations apply if the rows of the pre-programmed memory cells store different fixed values in alternative to the logic values 0 and 1 (for example, in multi-level memory cells). Furthermore, each word of the rows of pre-programmed memory cells may include a bit string including logic values being variously alternated to each other (e.g., in the case of 8-bit words, 01010101, 00110011, and so on); in any case, nothing prevents having all the memory cells being pre-programmed at the same value (e.g., 0 or 1).

Moreover, the rows and columns are to be understood in purely topological (and not physical) terms; for example, it is not excluded that the pre-programmed memory cells are arranged in columns, or that they occupy predefined positions being variously distributed within the matrix of the memory device.

Alternatively, the failure of the read test may be determined by a different number of errors (down to only one).

Clearly, the above-described algorithm for inferring the malfunctioning component is merely illustrative and should not be construed in a limitative way. For example, analogous considerations apply if there are carried out several read and/or write tests, if the results of such read and write tests are evaluated in a different way (for example, either according to percentages of the errors or according to their complete success/failure), if there are considered different causes of the failure of the functional test (for example, generic multiplexers being used both for reading and for writing), and the like. Moreover, nothing prevents using more complex decision techniques (for example, based on fuzzy logic).

Furthermore, the described analysis procedure may be supported by known functionalities of the memory device; for example, the analysis procedure, or some steps thereof, may be performed in STOV (Self Timing Override) mode so as to exclude, for example, the presence of large parasitic capacitive loads on the bit lines.

The above-indicated number of rows of pre-programmed memory cells is merely indicative; nothing prevents implementing the analysis procedure with a single row of pre-programmed memory cells. On the contrary, it is similarly possible to run more write tests (with bits being either equal or different to each other).

In addition, the rows of pre-programmed memory cells are not necessarily different to each other. For example, by using rows of pre-programmed memory cells being identical to each other, it is possible to exclude problems concerning the structure of the pre-programmed memory cells (e.g., because of short circuits or open circuits being created during wiring) or the row decoder (e.g., because of excessively resistive paths).

In any case, the proposed solution lends itself to be applied to any other memory device (for example, a non-volatile memory with rows of memory cells being pre-programmed during manufacturing).

Similar considerations apply if the memory device has a different structure or includes equivalent components (either separated or combined together, in whole or in part); in particular, it is possible to provide any number (one or more) of microcontrollers so as to speed up, for example, by managing them concurrently, some or all the operations of the previously described method.

It should be obvious that the proposed structure may be part of an integrated circuit design. The design may also be created in a programming language; moreover, if the designer does not manufacture the electronic devices or the masks, the design may be transmitted by physical means to others. In any case, the resulting integrated device may be distributed by its manufacturer in raw wafer form, as a bare die, or in packages.

Moreover, the proposed structure may be integrated with other circuits in the same chip, or it may be mounted in intermediate products (such as mother boards) and coupled with one or more other chips (such as a processor). In any case, the integrated device is suitable to be used in complex systems (such as automotive applications or microcontrollers).

Having thus described at least one illustrative embodiment of the invention, various alterations, modifications and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for testing a memory device including a matrix of memory cells having a plurality of rows and columns, the matrix including a plurality of rows of operative memory cells each one for storing a variable value and at least one row of auxiliary memory cells each one storing a fixed value, writing means for writing selected values into the operative memory cells, and reading means for reading the values being stored from the operative or auxiliary memory cells, wherein the method is comprises by the steps of:
   reading output values from the row of auxiliary memory cells,
   determining a malfunctioning of the memory device in response to a missing match of the output values with the fixed values,
   determining a cause of the malfunctioning according to a pattern of reading errors between the output values and the corresponding fixed values, and
   providing a signal indicative of the cause of the malfunctioning.

2. The method according to claim 1, wherein the memory device further includes a plurality of bit lines each one for accessing a corresponding column of memory cells, a plurality of word lines each one for enabling a corresponding row of memory cells, a row selector for selecting a word line, a plurality of column selectors each one for selecting a bit line of a corresponding set of bit lines for the reading, a plurality of reading elements each one for reading the value being stored in a memory cell of the word line beings elected and of the bit line being selected by a corresponding column selector, wherein the step of determining a cause of the malfunctioning according to a pattern of reading errors includes:
   determining the cause of the malfunctioning in the bit lines, in the column selectors and/or in the reading elements according to the pattern of the errors.

3. The method according to claim 2, wherein the memory cells of each row are arranged in a plurality of words each one formed by a plurality of memory cells, each memory cell occupying a same position within the corresponding word being coupled with a same reading element through the corresponding column selector, and wherein the step of determining the cause of the malfunctioning in the bit lines, in the column selectors and/or in the reading elements includes:
   determining the cause of the malfunctioning in the column selectors or in the bit lines in response to the lack of errors in at least one word.

4. The method according to claim 3, wherein the step of determining the cause of the malfunctioning in the bit lines, in the column selectors and/or in the reading elements further includes, in response to the presence of errors in each word:
   determining the cause of the malfunctioning in at least one reading element in response to errors of the memory cells in the corresponding position of all the words, or
   determining the cause of the malfunctioning in the bits lines, in the column selectors and in the reading elements otherwise.

5. The method of claim 1, wherein the memory device further includes at least one row of control memory cells each one storing a control fixed value, the method further including, for each row of control memory cells, the steps of:
   reading control output values from the row of control memory cells,
   determining a control cause of the malfunctioning according to a pattern of control reading errors between the control output values and the corresponding control fixed values, and
   setting the cause of the malfunctioning to an inconsistency of the memory device in response to a missing match of the control cause of the malfunctioning with the cause of the malfunctioning.

6. The method according to claim 5, wherein the control fixed values of each row of control memory cells are different from the corresponding fixed values.

7. The method according to claim 1, wherein the method further includes, in response to a match of the output values with the fixed values, the steps of:
   providing input values to the writing means,
   transmitting the input values from the writing means to the reading means for reading corresponding further output values,
   determining the malfunctioning of the memory device in response to a missing match of the further output values with the input values, and determining the cause of the malfunctioning according to a pattern of further reading errors between the further output values and the corresponding input values.

8. The method according to claim 7, wherein the memory device further includes a plurality of further column selectors each one for selecting a bit line of a corresponding set of bit lines for the writing, a plurality of writing elements each one for writing a selected value in a memory cell of the word line being selected and of the bit line being selected by a corresponding further column selector, the step of transmitting the input values from the writing means to the reading means including providing each input value to a corresponding bit line with all the word lines being unselected, and the step of determining the cause of the malfunctioning according to a pattern of further reading error including determining the cause of the malfunctioning in the further column selectors and/or in the writing elements according to the pattern of the further errors.

9. The method according to claim 8, wherein each memory cell occupying a same position within the corresponding word is further coupled with a same writing element through the corresponding further column selector, and wherein the step of determining the cause of the malfunctioning in the further column selectors and/or in the writing elements includes:

determining the cause of the malfunctioning in the column selector in response to the lack of further errors in at least one word.

10. The method according to claim 9, wherein the step of determining a cause of the malfunctioning in the further column selectors and/or in the writing elements further includes, in response to the presence of further errors in each word:

determining the cause of the malfunctioning in at least one writing element in response to further errors of the memory cells in the corresponding position of all the words, or determining the cause of the malfunctioning in the further column selectors and in the writing elements otherwise.

11. The method according to claim 1, wherein the memory device is a SRAM.

12. A memory device including a matrix of memory cells having a plurality of rows and columns, the matrix including a plurality of rows of operative memory cells each one for storing a variable value and at least one row of auxiliary memory cells each one storing a fixed value, writing means for writing selected values in the operative memory cells, and reading means for reading the values being stored from the operative or auxiliary memory cells, circuitry for reading output values from the row of auxiliary memory cells, circuitry for determining a malfunctioning of the memory device in response to a missing match of the output values with the fixed values, circuitry for determining a cause of the malfunctioning according to a pattern of reading errors between the output values and the corresponding fixed values, and circuitry for providing a signal indicative of the cause of the malfunctioning.

\* \* \* \* \*